United States Patent
Paatzsch et al.

(10) Patent No.: US 6,200,502 B1
(45) Date of Patent: Mar. 13, 2001

(54) PROCESS FOR THE PRODUCTION OF OPTICAL COMPONENTS WITH COUPLED OPTICAL WAVEGUIDES AND OPTICAL COMPONENTS PRODUCED BY SAID METHOD

(75) Inventors: Thomas Paatzsch; Ingo Smaglinski, both of Mainz (DE)

(73) Assignee: Institut fur Mikrotechnik Mainz GmbH (DE)

(*) Notice: Subject to any disclaimer, the term of this patent is extended or adjusted under 35 U.S.C. 154(b) by 0 days.

(21) Appl. No.: 09/125,911

(22) PCT Filed: Feb. 28, 1997

(86) PCT No.: PCT/EP97/01020

§ 371 Date: Aug. 27, 1998

§ 102(e) Date: Aug. 27, 1998

(87) PCT Pub. No.: WO97/32229

PCT Pub. Date: Sep. 4, 1997

(30) Foreign Application Priority Data

Feb. 29, 1996 (DE) .............................................. 196 07 671

(51) Int. Cl.$^7$ ...................................................... B29D 11/00
(52) U.S. Cl. .................... 264/1.25; 264/1.27; 264/1.37; 264/1.38; 264/2.5; 430/321; 205/70
(58) Field of Search .................................. 264/1.1, 1.25, 264/1.27, 1.36, 1.38, 1.24, 1.37, 2.5; 430/321; 205/70, 79

(56) References Cited

U.S. PATENT DOCUMENTS

| | | |
|---|---|---|
| 5,073,314 | 12/1991 | Coutandin et al. . |
| 5,311,604 | 5/1994 | Rogner et al. . |
| 5,526,454 | * 6/1996 | Mayer ................................ 264/1.24 |
| 5,594,824 | * 1/1997 | Kerndlmaier . |

FOREIGN PATENT DOCUMENTS 251 212 * 11/1987 (DE) .................................... 264/1.25

OTHER PUBLICATIONS

ECOC '93 Proceedings of the 19$^{th}$ European Conference on Optical Communication. Sep. 12–16, 1993, Montreux, CH. pp. 437–440, P. Dannberg et al. "Passive polymeric components fabricated by embossing technique", section "embossing technology".

SPIE Proceedings. Bd. 1973, Apr. 6–8, 1993, pp. 94–102, XP000677264 A. Gogner: "Precision components for optical fiber connections fabricated by the LIGA process" section 2: "the LIGA technique".

* cited by examiner

Primary Examiner—Mathieu D. Vargot
(74) Attorney, Agent, or Firm—Hudak & Shunk Co., L.P.A.

(57) ABSTRACT

The invention concerns a method for the fabrication of an optical component with at least one fiber taper receptacle and a coupled fiber taper For this, a microstructure body is first made by coating a substrate with resist, the height of the resist diminishing essentially continuously across one region of the substrate. Next, the resist is exposed to synchrotron radiation through a mask and then developed. By electroforming and molding methods, such as micro injection molding, replicas of the microstructure body are created in plastic, for example. The invention further concerns an optical component, which has at least one fiber taper receptacle and one coupled fiber taper. The fiber taper receptacle is configured as a trough with essentially rectangular cross section. The trough height and width decrease essentially continuously across at least one region.

11 Claims, 8 Drawing Sheets

PROCESS FOR THE PRODUCTION OF OPTICAL COMPONENTS WITH COUPLED OPTICAL WAVEGUIDES AND OPTICAL COMPONENTS PRODUCED BY SAID METHOD

The invention concerns a method for fabrication of optical components with at least one fiber taper receptacle wherein a microstructure body is fabricated, this microstructure body is electroformed and the resulting negative form is used as a form tool for fabricating molded pieces for the optical component by means of molding, as well as optical components fabricated by this method. Such components can be used, for example, in optical telecommunications or in sensors.

The transmission of signals and data in telecommunications and sensor engineering is occurring increasingly on an optical basis. Instead of electrical connections, optical connections are created by means of optical waveguides, the assemblage of which represents an optical network. To build up such a network, one requires the most diverse of components in large numbers at the cheapest possible price: these include connections (connectors, splices), signal dividers (branches), wavelength division multiplexers (WDM) and switches.

Optical waveguides consist of a so-called waveguide core and a waveguide material and are generally made of glass or plastic. The transport of the optical signal occurs essentially in the core of the optical waveguide. Depending on the transmission wavelength and size or index of refraction of the optical waveguide, one or more optical modes are used for the transport. Especially in the area of sensor technology and trunk transmission of data (transmission bandwidth), a single-mode transmission is required, which presupposes the use of so-called single-mode optical waveguides. Such single-mode optical waveguides have core dimensions in the range of 2–10 $\mu$m at the usual wavelengths (0.4–1.6 $\mu$m).

Especially high demands are placed on the connections of single-mode optical waveguides to each other or to optical components, due to the small dimensions of the core. For applications in optical telecommunications, it is necessary to observe a precision of $\pm 1$ $\mu$m for the fiber position in lateral direction and $\pm 0.5°$ for the angular orientation. Such tolerances, for example, for fiber band connectors (fiber ribbon: cable with several optical waveguides), can be achieved in that the connector is fabricated with positioning structures for the optical waveguide in the injection molding technique with the help of a high-precision form tool produced by microtechniques (H. D. Bauer, L. Weber, W. Ehrfeld: "LIGA for Applications for Fiber Optics: High Precision Fiber Ribbon Ferrule": MST News 10 (1994), p. 18–19)).

Integrated-optical components are also being used increasingly for the passive and active connection of optical signals. For this, an optical waveguide arrangement which fulfills a particular function (signal branching, switching, etc.) is integrated in a substrate. The coupling of optical waveguides to the component (observing the above-given tolerances!) can be done, for example, by an active or semi-active assembly process of the components, in which the position of the fiber is varied by measuring the optical power which is coupled in and measured at the exit, thereby optimizing it to a minimal loss. However, the expense of such a manufacturing technique is relatively high.

A very cost-favorable solution for the fabrication of such components is the use of polymer materials, which are processed in a molding process, such as injection molding, spray stamping, hot stamping, reaction casting, etc. In this connection, in addition to the waveguide regions it is also especially advantageous to integrate fiber guide regions in the component, in which the fibers need only be inserted, without subsequent adjustment. Such a fiber coupling is also known as a self-adjusting or passive fiber-chip coupling.

The use of the LIGA technique is especially advantageous for the fabrication of the components. This technique involves the three process steps of lithography, galvanics, and molding. In the first step, a resist is placed on a substrate and exposed to synchrotron radiation, for example, through a suitable mask. After the development, metal is galvanically deposited in the regions dissolved away from the resist, producing a shaping insert as a negative of the original structure. This shaping insert is used in a molding process (e.g., injection molding) to produce molded pieces of plastic, for example. Thanks to the LIGA technique, molded pieces can be produced with a very high precision (<1 $\mu$m). A detailed description of the LIGA technique will be found, for example, in: W. Ehrfeld, M. Abraham, U. Ehrfeld, M. Lacher, H. Lehr: "Materials for LIGA Products," Micro-Electrical Mechanical Systems: An Investigation of Microstructures. Sensors. Actuators. ed. by W. Benecke, published by The Institute of Electrical and Electronic Engineers, Piscataway, N.J.: IEEE Press. 1992.

From DE 42 12 208, a method of fabrication of an optical polymer component is known, in which a microstructure body is produced by means of Si-micromechanics and excimer laser machining. From this microstructure body, a shaping insert is created by electroforming, which is used for molding in a polymer material. The microstructure here has a v-shaped fiber receptacle and a trough for the waveguide.

In DE 42 17 526 A1, a method is described for fabrication of components for waveguide networks, in which fiber guide structures and waveguide preforms are fabricated by means of a stepped shaping insert in molding technology. X-ray deep lithography using a stepped substrate with subsequent galvanic forming is mentioned as the preferred manufacturing technique for the shaping insert. The fabrication of the stepped shaping insert is also the subject of Patent Application DE 43 10 296.

The drawback in both techniques from the state of the art is that fiber receptacle and waveguide are situated on two levels, separated by a step. But such a body is completely unsuited for accommodation of fiber tapers, since a definite positioning of the taper tips is not assured. If only because of the slight diameter of the fiber taper in the region of the tip, bending can easily occur when introducing the fiber taper, which would alter the position of the taper tips and thus result in a high insertion loss. Furthermore, the shape of the described receptacles is not adapted to the profile of the fiber taper, so that an overcoupling of the optical wave between fiber taper and fiber taper receptacle is not possible, as in DE 43 44 179.

A device for coupling of fiber tapers to optical waveguides is known from DE 43 44 179. The described device has a fiber taper receptacle which is adapted to the profile of the fiber taper. This ensures that an overcoupling of the optical field between fiber taper and fiber taper receptacle is possible. The cross section of the described fiber taper receptacle is circular or trapezoidal (two V-shapes, one on top of the other).

A method for fabrication of the proposed coupling device is not indicated in DE 43 44 179. Yet the indicated cross sectional shapes of the fiber receptacle are especially ill suited for the fabrication of the device. They cannot be fabricated in the desired precision and with the required low roughness of the walls with known fabrication techniques of precision engineering and microtechnology. Furthermore, the device has the definite disadvantage of specifying the troughs for the fiber taper receptacle in the bottom and top plate. Besides the bottom plate, therefore, a special shaping insert must also be fabricated for the top plate and this used to mold the shaped pieces of the top plate. Furthermore, for a good coupling function, bottom and top plate must be assembled and secured with very high precision (around 1 μm). But such a demand is only technologically feasible through very high expenditure (active positioning of the plates or self-adjustment through high-precision positioning elements).

EP 0 618 502 A1 describes a method for fabrication of stepped shaping inserts, in which two resist layers and two radiation exposure processes are employed, while in the meantime metal is deposited in selective regions and various intermediate layers are put in place. This method is not suitable for the fabrication of fiber taper receptacles.

The purpose of the invention is therefore to specify a simple method for fabrication of an optical component with fiber taper receptacle. Furthermore, the purpose of the invention is to create an optical component with a fiber taper receptacle which can be made especially advantageously with the indicated method and which does not have the above-described disadvantages.

The method according to the invention is characterized in that, to produce the microstructure body, a substrate is coated with a radiation-sensitive material so that the thickness of the layer of radiation-sensitive material continuously decreases in a first direction across at least one region of the substrate (transitional region), and a troughlike structure is incorporated in the coated substrate by a light exposure process, which continuously tapers in a second direction across at least one region (tapering region) and the light exposure process is carried out such that the tapering region and the transitional region eventually overlap.

Preferably, the coated substrate is exposed to the light through at least one mask with at least one absorber-free region, wherein the absorber-free region tapers continuously in a second direction across at least one region (tapering region) and the mask is oriented to the coated substrate such that the first and the second direction lie parallel or antiparallel. It is also possible for the two directions to subtend an angle >0. The fiber taper receptacle can be fabricated on the basis of LIGA technique with very high precision and little wall roughness. Furthermore, the fiber taper receptacle can be adapted to the profile of the fiber taper, thereby assuring the above-described overcoupling of fiber taper and receptacle.

Because the method is further distinguished in that shaped pieces are fabricated by molding from a shapable material and core material and fiber taper are inserted in the molded pieces and a cover plate is set in place, a very cost-favorable fabrication of the optical components is possible. The method, furthermore, is suitable for mass production.

Preferably, the transitional region of the radiation-sensitive material passes gradually into a second region with constant height. The tapering region on the mask also passes gradually into a second absorber-free region of constant width, intended for the wave region.

Since, in an advantageous embodiment of the invention a substrate with profiled top side is used and the coating of the substrate with radiation-sensitive material occurs in such a way that the surface of the radiation-sensitive material is level, the height of the radiation-sensitive material (and, thus, the height of the trough of the fiber taper receptacle) can be adjusted with very high precision. Furthermore, there is the clear advantage of being able to use commonplace and cost-favorable fabrication methods such as wire erosion and polishing techniques for the fabrication of the profiled substrate with coating.

It is advantageous to coat the substrate with an x-ray sensitive resist and to use synchrotron radiation for the exposure. In this way, a very high structural precision and low roughness of the side walls is assured. This is especially important for the function of waveguide regions (e.g., Y-branches). But it is also possible to use a photoresist in combination with conventional UV lithography or reactive ion etching (RIE). Furthermore, the mask can be dispensed with and the structure can be written directly into the resist, for example, by means of electron beam printer or laser printer.

Since a fiber/waveguide coupling can be achieved in that a second region for a waveguide is provided on the substrate at the region allocated to the taper receptacle, and the further fabrication of fiber taper receptacle and waveguide takes place in a single piece, a very high precision can be assured, especially at the coupling site between fiber taper receptacle and waveguide. In this way, very small values are possible for the insertion loss of the fiber/waveguide coupling.

Because the tapering of the fiber taper receptacle in one spatial direction occurs in that a continuously diminishing resist height is adjusted in the fabrication process, the troughs for the fiber taper receptacle are contained only in the molded piece, but not in the cover plate. Therefore, a flat plate is sufficient as the cover, which can be obtained very easily, for example, by sawing from a plate. Furthermore, a precise mounting of base and cover plate is not necessary, which enables a very simple and economical assembly process (gluing, laser welding).

Because the introduction of the fiber taper into the receptacle can occur in that core material is first inserted, bottom and cover plate are mounted, and then the fiber taper is shoved fully into the fiber taper receptacle, there is a self-adjusting of the fiber taper to the receptacle (passive fiber/chip coupling!). This further simplifies the assembly process considerably.

Since the optical component has a fiber taper receptacle with essentially rectangular cross section, it can be fabricated especially easily by the method of the invention.

In one advantageous embodiment, the fiber taper receptacle of the optical component is adapted to the fiber taper profile. This enables an overcoupling of the optical wave between fiber taper and receptacle (cf. DE 4344179 A1), which ensures a very low insertion loss and a plurality of new applications. These include: low-loss coupling of fibers to waveguides with any given dimensions and indices of refraction or even to waveguides with elliptical field profile; furnishing of a fiber coupling device even for waveguides fabricated in a different technology (e.g., doped waveguides of glass, SiON waveguides in Si-technology); low-loss connectors for coupling of fiber ribbons; coupling of light into an optical component having free beam segments for the light; formation of the exit channel of a laser diode, for example, for coupling light into a glass fiber; coupling of an optical wave into a sensor platform or into a microtechnical analysis system.

The method according to the invention concerns optical components which are characterized in that the fiber taper receptacle has a trough with rectangular cross section and the height and width of the trough diminish continuously over at least one region. Such components can be, for example, passive or active integrated optical components (mxn-branches, switches, modulators, wavelength multiplexer-demultiplexer, sensors, etc.), fiber connection elements (splices, fiber connectors), or optical components which contain regions with free beam optics (e.g., matrix switches, interferometers, etc.).

The fabrication of the optical components is based on the LIGA technique. According to the invention, at first a substrate is coated with a resist, the height of the resist diminishing continuously in at least one region assigned to the fiber taper receptacle. In addition, however, other regions may exist, for example, with constant resist height. The adjustment of the resist height is done advantageously by means of precision mechanical methods such as erosion, polishing, or polish-milling.

Next, a form tool is fabricated by electroforming and this is used in familiar fashion for the molding of shaped pieces in a molding material. For this, one may consider forming methods such as injection molding, hot stamping, spray stamping, reaction casting, etc.

In an advantageous embodiment, the coated substrate is exposed to light. For this, a mask is used, having absorber-free regions which taper essentially continuously, at least in one region assigned to the taper receptacle. For the exposure, the mask and the coated substrate are oriented to each other such that the tapering regions assigned to the taper receptacle come to overlap. After the exposure, the development of the resist occurs in familiar fashion.

In fabricating a fiber/waveguide coupling, it is advantageous for the region with decreasing resist height to pass gradually into a second region, especially one with constant resist height. Furthermore, it is advantageous when the tapering absorber-free region on the mask passes gradually into a second region provided for the waveguide. In this second region, the function of the integrated optical component (e.g., Y-branch) can be integrated. The waveguides can have a square or a rectangular cross section. The use of rectangular waveguides is especially advantageous when the polarization of the carried wave needs to be preserved.

In a special embodiment of the method, a substrate with planar bottom and profiled top is used. The height profile of the substrate top is configured such as to increase continuously in at least one region assigned to the fiber taper receptacle. To make a fiber/waveguide coupling, at least one second region with essentially planar top can be provided for the waveguide. It is advantageous for this region to be oriented parallel with the bottom of the substrate. The fabrication of the profiled substrate occurs, for example, by means of wire erosion, multiaxial polish-milling, ultra precision milling, or a method explained hereafter.

Furthermore, it is advantageous to coat the substrate with resist in such a way that the top of the resist is flat and the desired height profile of the resist is produced as the difference between the profiled substrate top and the resist surface. To make a fiber/waveguide coupling, moreover, it may be advantageous to adjust the resist surface such that it is parallel to the substrate surface in the region assigned to the waveguide. In this way, a constant waveguide height is assured. But it can also be desirable to vary the resist height in the waveguide region and thus achieve a variable waveguide height, when such is advantageous to the function of the component. For the coating, the resist is applied, for example, by pouring and then finished with polishing or polish-milling. It is especially advantageous to orient the resist surface parallel to the bottom of the substrate.

Besides the substrate, the top of the resist can also be provided with a height profile, e.g., by polish-milling. This provides further possibilities for configuration of the optical component.

In order to reduce the additional machining of the shaping insert later on, it is advantageous to arrange for low relief of substrate top (corresponding to resist bottom) and resist top. However, one must take into account the generally known fact that it is necessary to provide a sufficient adhesion of the resist to the substrate. The reduction of the relief can be done by familiar polishing methods. It may be advantageous to select the thickness of the substrate such that it can be placed on a flat polishing disk by slight elastic bending.

In an advantageous embodiment of the method, a cover plate is mounted on the shaped piece made by molding. The fabrication process according to the invention has the major advantage that no troughlike openings for the fiber taper receptacle are provided in the cover plate. For this reason, it is not necessary to line up the bottom and top plate with high precision.

The introduction of the fiber taper into the receptacle is done to special advantage in that, first of all, the shaped piece and the cover plate are mounted together and core material is introduced, and then the fiber tapers are shoved fully into the openings of the receptacles. Yet a different sequence of the described process steps can also be chosen for introducing the fiber taper.

After introducing the fiber taper, the core material is consolidated.

There are other manufacturing processes for fabricating the above-described profiled substrate, which shall be explained hereafter:

One method involves the fabrication of the substrate by means of excimer laser machining. At first, a substrate is coated with a resist and then the resist surface is machined with an excimer laser. The height profile can be adjusted by depositing different dose values in different places of the resist surface. The profile is transferred to metal by subsequent galvanic forming. Excimer laser machining can also transfer other structures necessary to the functioning of the optical component (positioning aids, etc.) to the substrate.

Another method which can be considered is UV gray tone lithography. Here, exposure through a mask with continuously varying absorption is employed. Depending on the locally deposited dose in the resist, the resist is more or less developed in depth, which leads to a variable height profile. The profile can be transferred to metal by subsequent electroforming.

Another method which can be considered for producing a profiled substrate is x-ray deep lithography. In this case, it is especially advantageous to transfer the cross section profile of the substrate to an x-ray mask by familiar techniques with very high precision. Through exposure of a resist to synchrotron radiation, development, and galvanic filling of the developed regions, one obtains the substrate in "edgewise" orientation (FIG. 3). Thus, substrate widths of several mm can be obtained by means of so-called ultradeep x-ray exposures.

An optical component with at least one fiber taper receptacle and at least one coupled fiber taper can be fabricated to special advantage with the method according to the invention when the fiber taper receptacle has a trough with an essentially rectangular cross section, and the width and height of the trough diminish continuously over at least one region.

In an advantageous embodiment of the optical component, the decrease in trough height and width is adapted to the profile obtained during thermal drawing of fibers. This ensures the possibility of an overcoupling of the optical wave between fiber taper and its receptacle, which results in a number of applications (see above). For such an adaptation, it may be advantageous, for example, to measure the diameter profile for a large number of drawn fiber tapers and to set the profile of the fiber taper receptacle approximately equal to the sum of the mean value and standard deviation of the measured values. This makes it possible to introduce all fiber tapers into the receptacle within the typical range of fluctuation in the fabrication of the fiber taper. Depending on the actual course of the fiber taper's profile, the fiber taper will then be shoved more or less into the receptacle until it comes to a stop, while retaining the function of the above-described overcoupling of the optical wave.

To make a fiber/waveguide coupling, it is advantageous for the tapering trough of the fiber taper receptacle to pass gradually into a second trough provided for the waveguide.

In a preferred embodiment, the trough of the fiber taper receptacle is enclosed on all sides. By selecting a material with suitable index of refraction for the exterior space, a good optical function can be assured, e.g., for a fiber/waveguide coupling.

A trough enclosed all around for the fiber taper receptacle can be created, for example, in that the optical component is comprised of a shaped piece and a cover plate. It is especially advantageous that only the shaped piece, but not the cover plate, has a trough for the fiber taper receptacle. Furthermore, it is advantageous for the fiber taper receptacle to be fashioned such that the top side of the fully enclosed trough is flat. In simple manner, an essentially flat plate can then be used for the cover plate in this case.

In another preferred embodiment, the trough for the fiber taper receptacle is open at the top. This ensures that the optical wave is guided at least partly onto the surface of the optical component. Such an optical component can be used with great advantage for sensor engineering, since the light wave then reacts, for example, to changes occurring on the surface.

It is advantageous to introduce a second material into the fiber taper receptacle, which fills the free spaces between the receptacle and the introduced fiber taper. In the case of a fiber/waveguide coupling, the introduced material can be used advantageously for the core of the waveguide.

In another preferred embodiment, the taper receptacle extends beyond the fiber taper, at least at the tapering side. Beyond the fiber taper, the receptacle can then taper again, for example, until the height of the trough reaches a final value of h0 and the width a final value of b0. The taper can be connected to a waveguide with dimensions of h0 and b0, being coupled to it with low loss. To special advantage, the dimensions of the waveguide can also be significantly smaller than the core of the fiber used for the coupling, for example. It is also advantageous that b0 and d0 can take on different values, so that low-loss coupling can also occur in a rectangular waveguide with elliptical field cross section.

In another preferred embodiment, the fiber taper receptacle has an end surface at its tapering end, which is essentially perpendicular to the axis of the fiber taper. This is especially advantageous when the optical component is a fiber connector or has regions with optical free beam.

The invention shall now be explained more closely by means of the sample embodiments presented in the drawings. These show:

FIGS. 3(a–b), 4(a–b), 5(a–b) various embodiments of the fiber taper receptacle.

Figure 1:
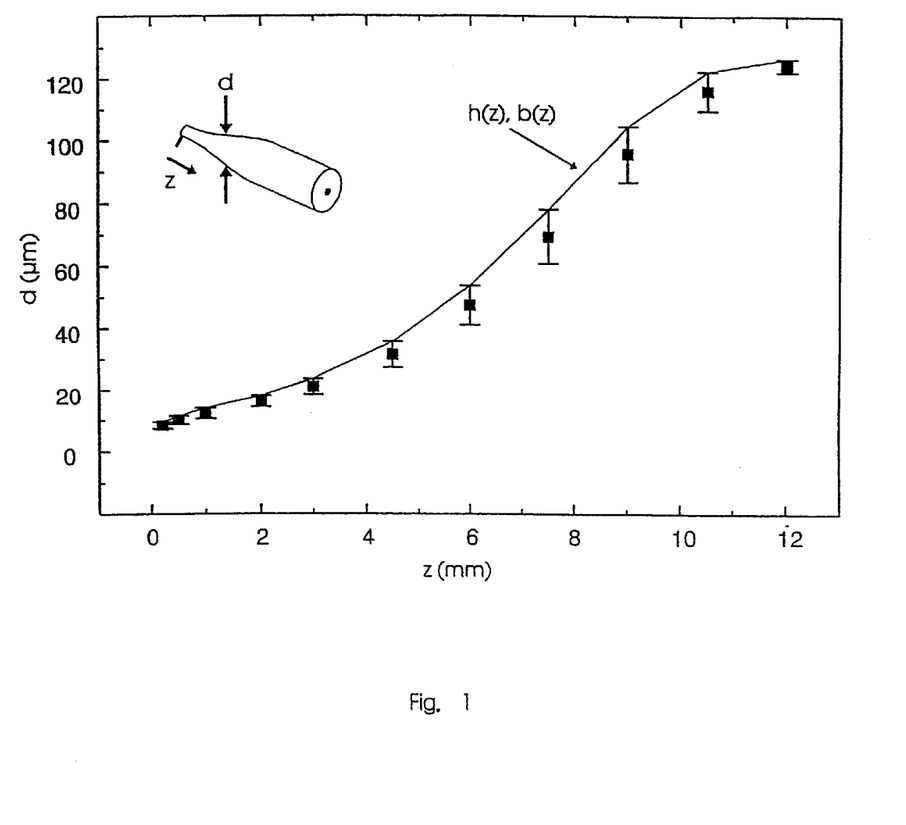
FIG. 1 profile of fiber tapers fabricated by drawing in a gas flame and a diagram showing the diameter d as a function of the taper length.

FIG. 1 shows the profile of fiber tapers which been fabricated by a familiar drawing process in gas flame. The diagram contains the mean value and standard deviation of the diameter at various places for approximately 90 fiber tapers. The fluctuations in diameter of around ±2 $\mu$m in the front part and maximum ±9 $\mu$m in the middle region of the taper yield the preferred profile for the design of the taper receptacle h(z), b(z).

FIG. 2 shows the individual fabrication steps of a preferred embodiment of the fiber taper receptacle with waveguide connecting to it. This is based on the fabrication of polymer waveguides in LIGA technology, already discussed in the state of the art. Only the fabrication steps which are new in the context of the invention shall be explained in greater detail.

Figure 2A:
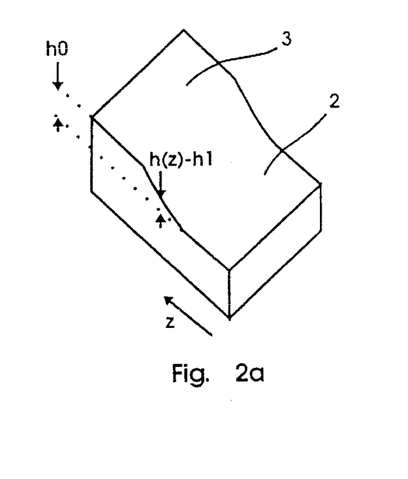
FIGS. 2a–2h fabrication of a fiber/waveguide coupling in LIGA technology.

In the first step, the profiled substrate 1 shown in FIG. 2a is fabricated from, e.g., copper, by means of wire erosion or polish-milling, for example. The preferred profile form h(z) in the region of the fiber taper receptacle 2 is shown in FIG. 1. In the waveguide region 3, a flat platform with constant profile height h0 is placed. The precision machining can also be combined with a polishing process, in order to diminish the roughness of the substrate surface. This has the advantage of reducing the expense for the subsequent machining of the form tool 7 (see FIG. 2e).

Figure 2B:
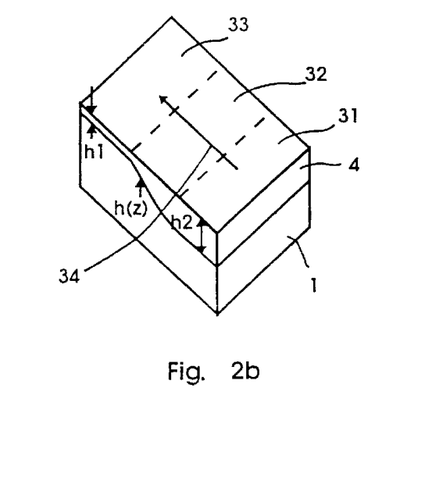

FIG. 2b shows the substrate 1 coated with the resist material 4. The resist material can be divided into three regions 31, 32, 33. Region 31 characterizes the thick region, which passes via a transitional region 32 into a thin region 33. The associated direction, which shall be termed the first direction, is indicated by reference number 34.

In order to assure a sufficient adhesion of the resist 4 to the substrate 1, it is possible to apply a bonding agent, as is known in the state of the art, and adjust the roughness of the substrate surface in the above polishing process to a suitable value. The adjustment of the resist height by means of precision machining methods such as polish-milling or polishing is done such that the resist surface is level and parallel to the substrate surface in the waveguide region 3 (see FIG. 2a). The height h1 is 8 $\mu$m, for example, and essentially corresponds to the height of the waveguide being produced.

Figure 2C:
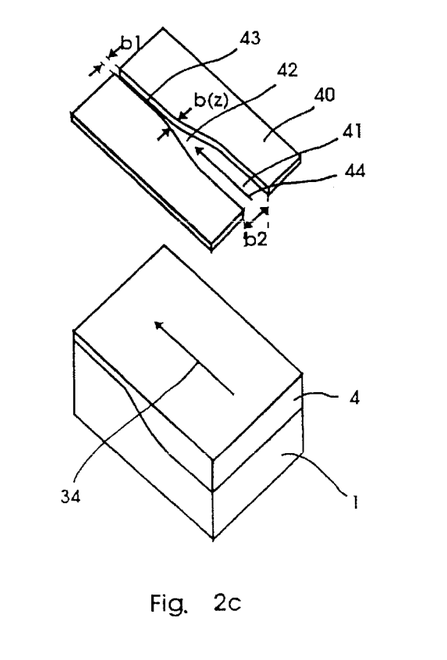
Figure 2D:
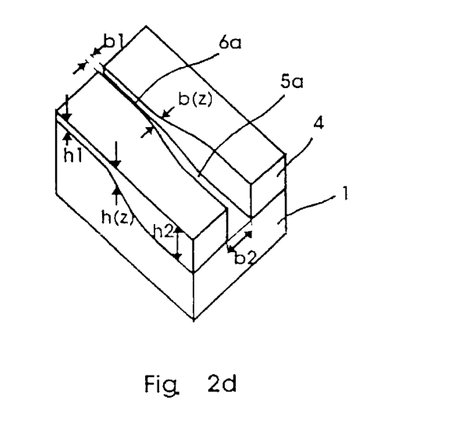

FIG. 2c shows the substrate 1 coated in FIG. 2b. On top of the resist material 4 is arranged a mask 40, having an absorber-free region, which likewise comprises three regions 41, 42 and 43. Region 41 corresponds to the later region for the taper receptacle and passes into the transitional region 42, which adjoins the later waveguide region 43. The second direction established in this way is indicated by the arrow 44. The mask 40 is arranged on top of the resist material 4 such that the two directions 34 and 44 are parallel to each other.

After orienting the mask 40, the exposure to synchrotron radiation is done. The x-ray mask 40 used has absorber-free regions, which taper from a value b2 of around 125 $\mu$m (fiber diameter) to the waveguide width b1 of, e.g., 8 $\mu$m. The variable width b(z) corresponds preferably to the curve indicated in FIG. 1. Simulators have shown that a precision of ±50 µm is sufficient for a good coupling function. After the radiation exposure, the resist is developed. The regions for the fiber taper receptacle 5a and waveguide 6a are exposed in this process (see FIG. 2d).

Figure 2E:
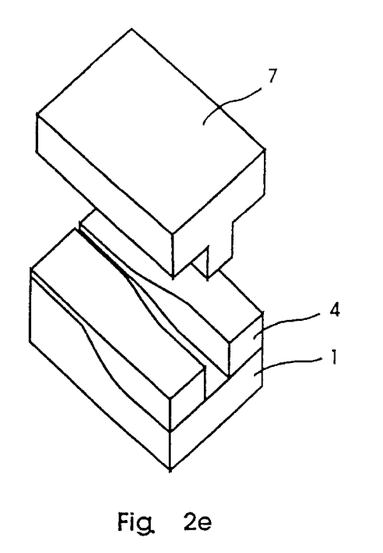

FIG. 2e shows the form tool 7 obtained after electroforming and stripping of the substrate 1. In order to achieve a sufficiently smooth bottom surface for the waveguiding (see FIG. 2f), the bottom of the form tool 7 is subjected to a polishing process. Depending on the polishing cloth used, it may be necessary to elastically bend the form tool, so that the waveguide region is placed on the level polishing disk.

Figure 2F:
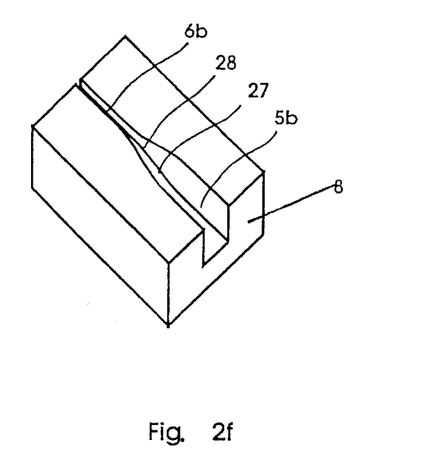

FIG. 2f shows a polymer molded piece 8 with the fiber taper receptacle 5b and the waveguide receptacle 6b, fabricated by means of the form tool 7, e.g., in the injection molding process. The receptacles form a trough 27 with rectangular cross section, the trough 27 having a region 28 which rises continuously in the direction of the waveguide receptacle 6b.

Figure 2G:
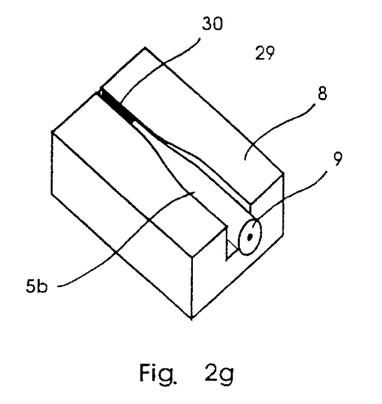

FIG. 2g shows the polymer molded piece 8 with introduced fiber taper 9 as well as inserted core material 30. The fiber taper 9 is slightly bent while being introduced into the receptacle (explained more closely in FIG. 4).

Figure 2H:
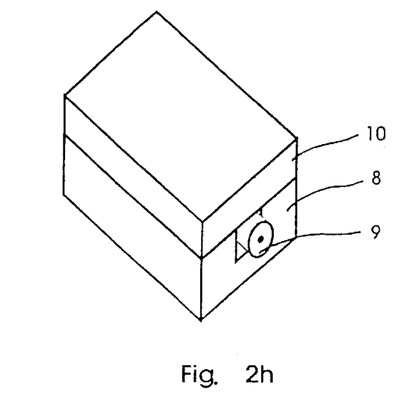

FIG. 2h is analogous to FIG. 2g with the flat cover plate 10 in place. The core material has been hardened for fixation.

The fabrication process described in FIG. 2 pertains only to the fiber/waveguide coupling of an integrated optical component. From the state of the art, it is known how to fabricate a complete component by means of several fiber/waveguide couplings and integrated waveguides. Such components can be 1×N-branches, switches, WDM, etc.

Figure 3A:
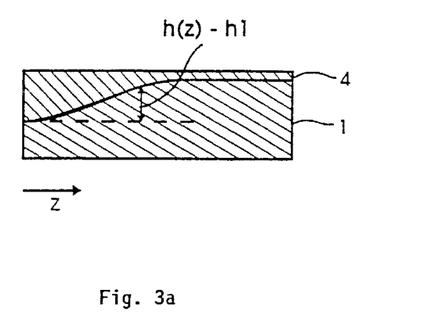
Figure 3B:
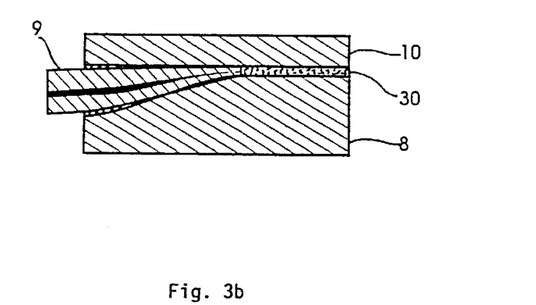
Figure 4A:
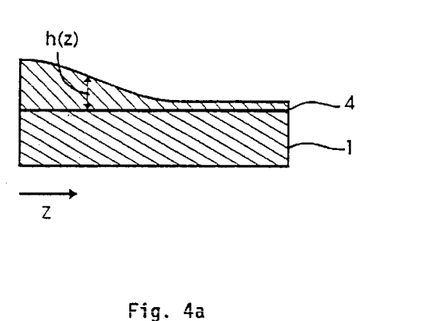
Figure 4B:
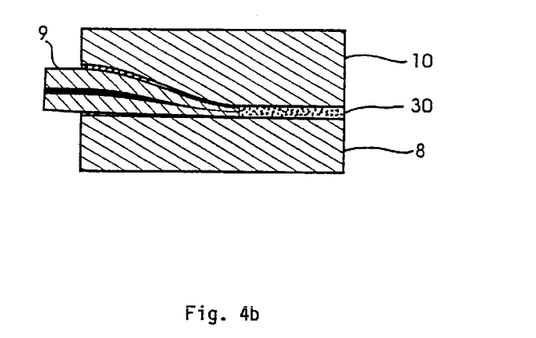
Figure 5A:
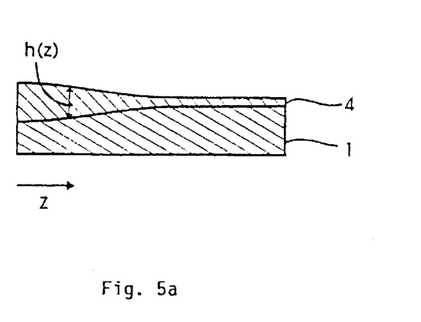
Figure 5B:
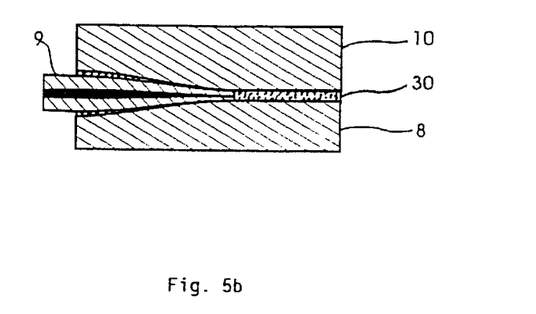

FIGS. 3–5 show various embodiments of the fiber/waveguide coupling. FIGS. 3a, 4a and 5a correspond to the cross section of the coated substrate (cf FIG. 2d) and FIG. 3b, 4b and 5b to the cross section of the component with fiber taper introduced (cf FIG. 2h).

FIG. 3 is identical to the embodiment described in FIG. 2. The profiled substrate 1 has a surface profile h(z)−h1 and the surface of the resist 4 is flat. The taper 9 is bent in order to introduce it into the taper receptacle between shaped piece 8 and cover plate 10. But this bending is extremely slight, since only a displacement of around 60 µm is required for the taper length of; e.g., 12 m. The fiber taper 9 adjoins the waveguide material 10.

In FIG. 4, a flat substrate is used and a resist height profile h(z) is adjusted, for example, by multiaxial polish-milling. The top of the shaped piece 8 fabricated by this process variant is no longer flat, but instead corresponds to the profile h(z). Therefore, a plate with inverse surface profile h(z), for example, can be used as the cover plate 10. Yet it is also possible to use a sufficiently thin, flat plate, which is slightly bent when mounted on the shaped piece. In this case, the cover plate has no trough for the fiber taper receptacle.

In FIG. 5, both the substrate 1 and the resist surface are profiled, yielding the profile curve h(z) for the resist height as a whole. This requires both a "profiling" of substrate surface and of the resist surface. In this process variant, it is not necessary to bend the fiber taper 9 when introducing it into the receptacle.

Figure 6:
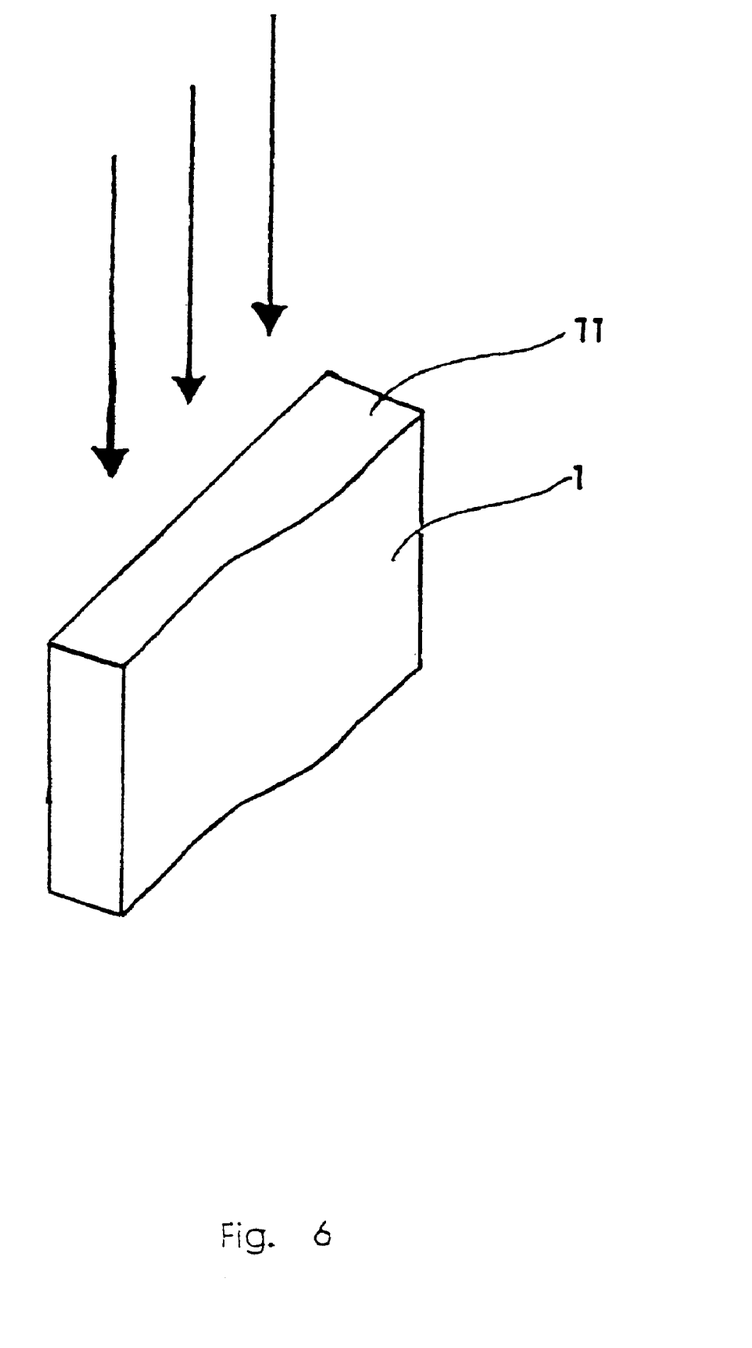
FIG. 6 fabrication of the profiled substrate by means of x-ray deep lithography.

FIG. 6 shows the fabrication of the profiled substrate by the use of x-ray deep lithography. For this, a substrate is coated with resist and the exposure to synchrotron radiation is carried out. After the development, the exposed regions are galvanized. FIG. 6 shows the profiled substrate 1 and the direction of the synchrotron beam parallel to the surface being profiled. The mask has absorber-free regions in the shape of the substrate cross section 11. Thanks to new methods of "ultradeep" x-ray lithography, substrate plates several millimeters wide can also be produced.

Figure 7:
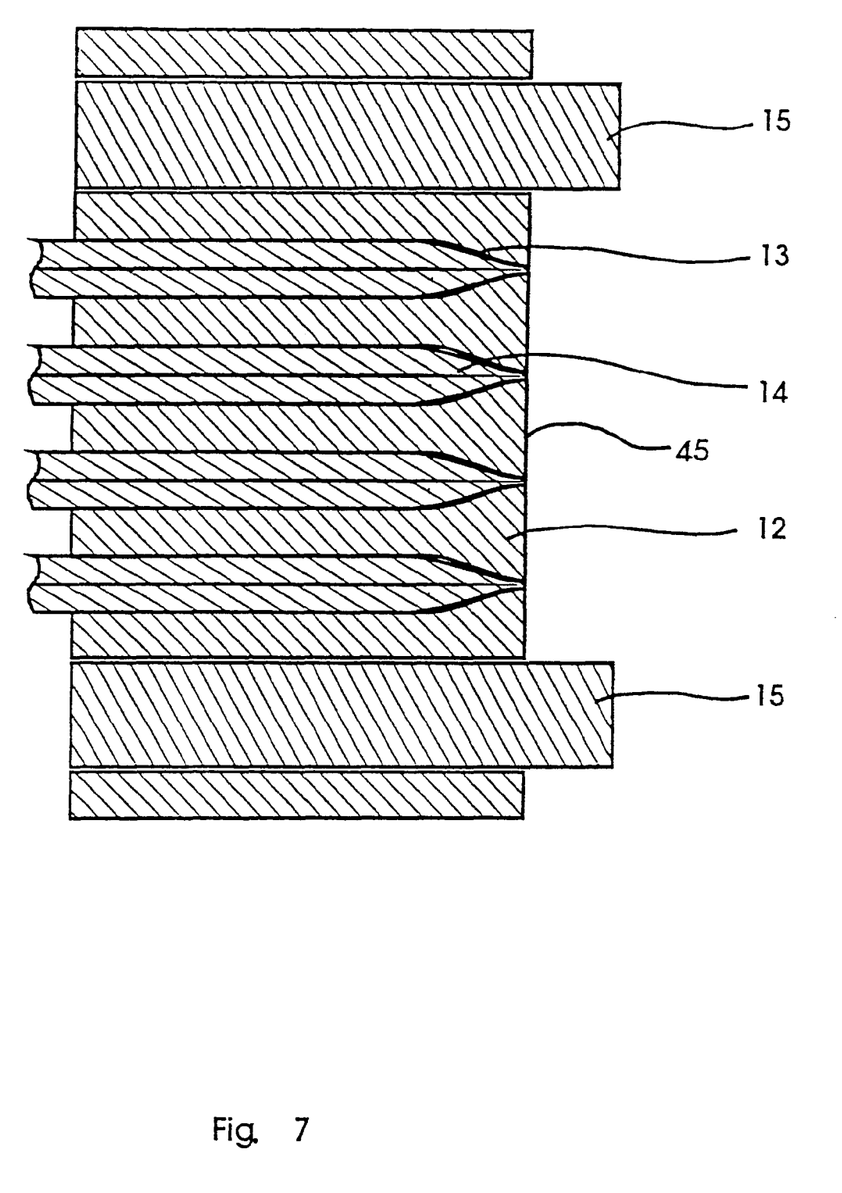
FIG. 7 an optical fiber ribbon connector.

FIG. 7 shows the cross section of a fiber ribbon connector, as is already known in comparable design from the above-cited state of the art. What is new is the use of fiber tapers 14 instead of simple fibers. The connector consists of a molded piece 12 with fiber taper receptacles 13, into which the fiber tapers 14 are introduced. In addition, the connector has positioning pins 15, which are used to line up a mating piece.

At the front end of the fiber connector there is a flat end surface 45, which can be inclined to the axis of the introduced fiber taper by 82° for example (reduction of the reflection loss!). It is especially advantageous when the dimension of the fiber taper receptacle at the end surface is larger (by 20 µm, e.g.) than the core of the fibers being used. In this way, the diameter of the optical field upon exiting from the taper receptacle is also larger than is the case at a fiber end surface. This has the result, as is known from optical waveguide coupling, that the sensitivity of the insertion loss to the lateral or axial adjustment of the halves of the connector is considerably reduced at large field diameters. For the same lateral offset (offset perpendicular to the axis of the fiber taper), the use of fiber tapers can thus reduce the insertion loss greatly (e.g., by a factor of 10).

Figure 8:
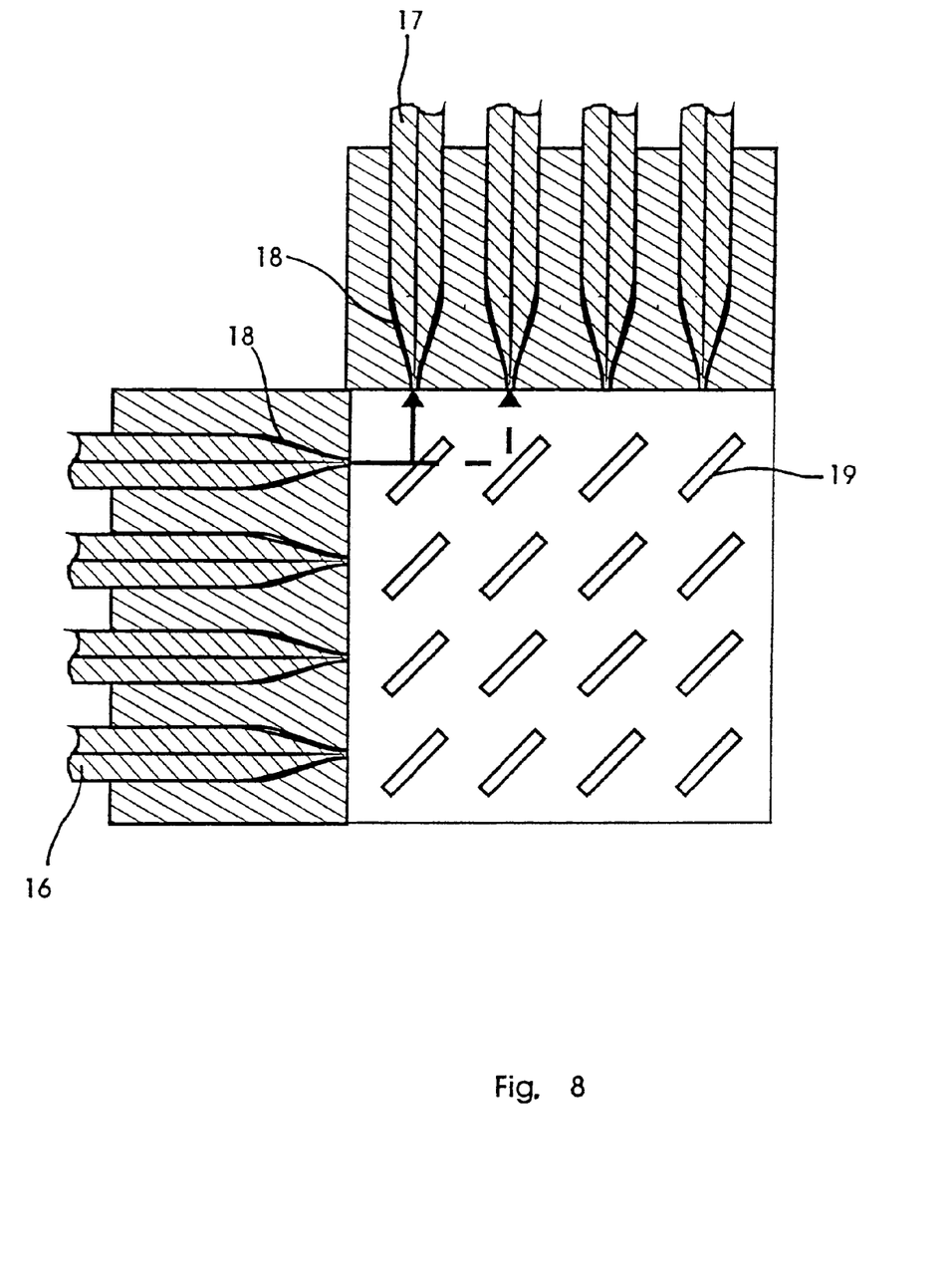
FIG. 8 a cross-bar distributor.

FIG. 8 shows the use of fiber tapers in a 4×4 cross-bar distributor. The cross-bar distributor has fiber taper 16 at the input side and fiber taper 17 at the output side. The fiber tapers are oriented by the taper receptacles 18 and fixed. In the middle region there are "switchable" mirrors 19, which can be individually actuated and switched to transmission or reflection. As indicated by the two beam pathways, the incoming optical signal can be switched to any desired output fiber in this way.

As in the example of the fiber connector, an end surface is fabricated at the front side of the fiber taper receptacle. It is again especially advantageous to concentrate the taper receptacle at a minimum value of, e.g., 20 µm at the tip, because this produces a much slower broadening of the field in the free beam region of the switch as compared to the fiber end surface. In this way, the transmission loss of the switch is considerably reduced.

In the arrangement of the cross-bar distributor shown in FIG. 8, other optical elements (lenses, etc.) can also be integrated, when such is advantageous.

Fiber tapers can also be used for other components with free beam optics (e.g., new kinds of branches, WDM etc.). In all cases, it is especially advantageous that the axial broadening of the field occur relatively slowly and little precision is necessary for the lateral orientation of fiber tapers being coupled together.

Figure 9:
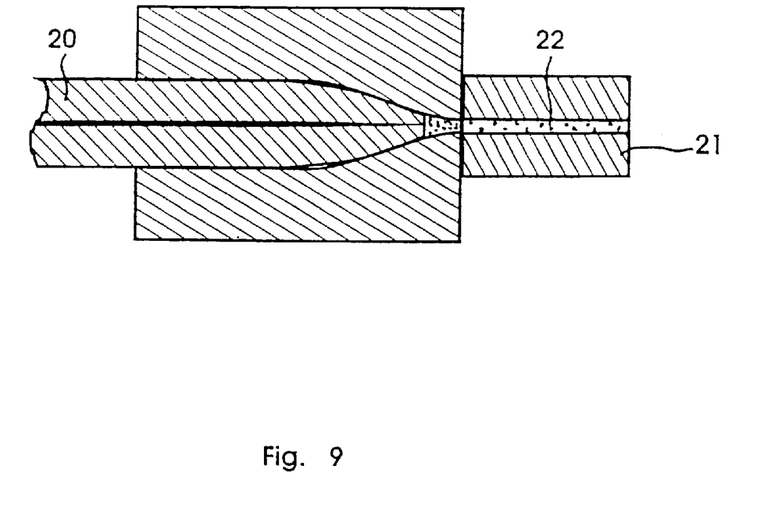
FIG. 9 a coupling device for waveguide components in silicon.

FIG. 9 shows the coupling of a fiber taper 20 to a semiconductor chip 21 with integrated waveguide 22. The waveguide 22, for example, can be fabricated by the familiar SiON technique on silicon. Such a waveguide generally has dimensions which are much smaller than the core diameter of a fiber. In addition, the optical field carried in the waveguide often has an elliptical cross section. A coupling of a standard fiber to such a waveguide by methods from the state of the art is laborious and generally entails high losses.

On the other hand, the use of fiber tapers has the advantage that the optical field can be formed within the taper receptacle and be adapted to the waveguide field, for example, without losses. In this way, very small insertion losses can be achieved. It is especially advantageous to use for the coupling a taper receptacle which is longer than the fiber taper. While the field diameter in the region of the fiber taper tip is typically 10 μm, in the region of the receptacle lying beyond this it is concentrated, for example, to an elliptical cross section with semiaxes of 1×2 μm. For this, the profiles h(z) and b(z) (cf. FIG. 2) are so selected during the fabrication that they decrease continuously in the rear region of the receptacle from 10 μm to 1 or 2 μm.

Figure 10:
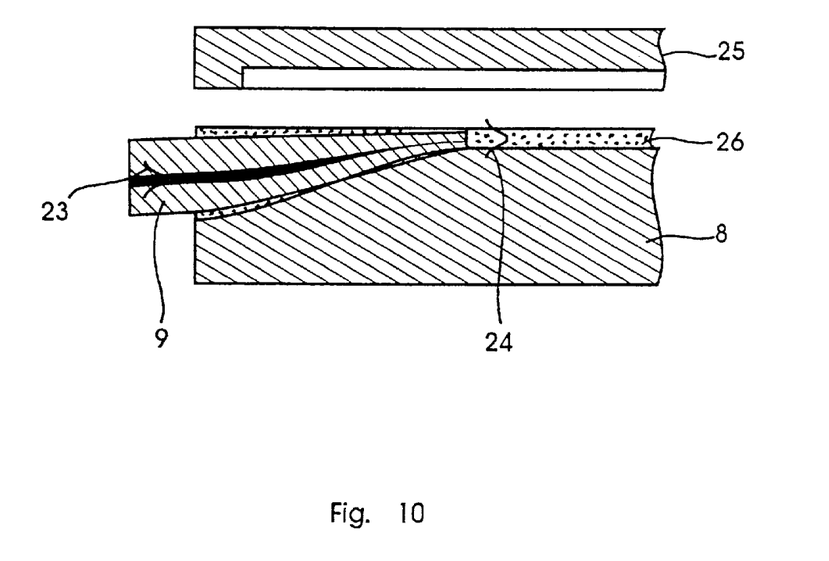
FIG. 10 a coupling device for a sensor.

FIG. 10 shows the coupling of a fiber taper to a waveguide for sensor engineering. The device has a molded piece 8 with fiber taper receptacle and introduced fiber taper 9 and the waveguide region 26. In order that the optical wave 23, 24 can respond to changes in the surroundings, it is carried on the surface of the component. The waveguide region can be configured, for example, in the form of a Mach-Zehnder interferometer, if it is required to detect a phase change in the optical wave. It is especially advantageous that the surface of the sensor is planar and thus can easily be accommodated on the sensor, for example, [using] a microcell 25.

The fabrication of the surface waveguide can occur, for example, in that a glass plate with separating layer is used as the cover plate. After consolidating the core material, the glass plate is lifted off from the molded piece and the waveguide is exposed.

List of Reference Numbers

1 Substrate
2 Fiber taper receptacle
3 Waveguide region
4 Resist
5a,b Fiber taper receptacle
6a,b Waveguide receptacle
7 Form tool
8 Molded piece
9 Fiber taper
10 Cover plate
11 Side surface
12 Molded piece
13 Fiber taper receptacle
14 Fiber taper
15 Positioning pin
16 Fiber taper
17 Fiber taper
18 Fiber taper receptacle
19 Mirror
20 Fiber taper
21 Semiconductor chip
22 Waveguide
23 Optical wave
24 Optical wave
25 Microcell
26 Waveguide region
27 Continuous region
28 Trough
28 Trough
29 Waveguide
30 Thick region
31 Transitional region
32 Thin region
33 First direction
34 Mask
40 Broad absorber-free region
42 Tapering region
43 Narrow absorber-free region
44 Second direction
45 End surface

What is claimed is:

1. A method for fabrication of components having at least one fiber taper receptacle, comprising the steps of:
    A) fabricating a microstructure body comprising the steps of:
        1) coating a substrate with a radiation-sensitive material, said radiation-sensitive material having a thickness which decreases continuously in a first direction across at least a transitional region of said radiation-sensitive material;
        2) forming a structure, substantially in a shape of a trough which is essentially rectangular in cross section, in said radiation-sensitive substrate coating by a light exposure process, said structure continuously tapering in a second direction across at least a tapering region thereof, said light exposure process conducted so that said tapering region and said transitional region come to overlap;
    B) electroforming a form tool by utilizing said microstructure body, said form tool having a surface which is a negative of said microstructure body; and
    C) molding an optical component having at least one fiber taper receptacle by utilizing said form tool as a mold.

2. A method according to claim 1, further comprising the step of arranging at least one mask on said coated substrate before said light exposure process, said mask being capable of absorbing energy from said light exposure process, said mask having at least one absorber free region, thus allowing energy from said light exposure process to pass therethrough said absorber free region having a tapering region tapering continuously in a second direction across said tapering region, said mask oriented on said coated substrate such that said first and said second directions are parallel or anti-parallel.

3. A method according to claim 1, wherein the coating is done such that the transitional region of the radiation-sensitive material passes gradually into a second region with constant height.

4. A method according to claim 2, wherein said absorber free tapering region of said mask passes gradually into a second absorber-free region of constant width, provided for a waveguide.

5. A method according to claim 4, wherein said substrate is profiled, and wherein the height profile of the substrate increases essentially continuously in the first direction across at least one region.

6. A method according to claim 1, wherein the coating of the substrate results in the radiation-sensitive material having a flat surface.

7. A method according to claim 1, wherein said radiation-sensitive coating material is an x-ray sensitive resist or a photoresist and said light exposure process uses synchroton radiation or UV light.

8. A method according to claim 1, wherein a core material is introduced into the fiber taper receptacle of the molded optical component, which is consolidated after the fiber taper is introduced.

9. A method according to claim 1, wherein an end surface is created at the tapered end of the fiber taper receptacle.

10. A method according to claim 5, wherein the profiled substrate is fabricated by wire erosion and/or ultra precision milling and/or excimer laser machining and/or UV gray tone exposure.

11. A method according to claim 5, wherein the profiled substrate is fabricated by means of x-ray deep lithography, followed by electroforming, wherein the direction of the x-ray beam is parallel to the profiled surface of the substrate.

* * * * *